(12) United States Patent
Ghia et al.

(10) Patent No.: US 6,366,128 B1
(45) Date of Patent: Apr. 2, 2002

(54) CIRCUIT FOR PRODUCING LOW-VOLTAGE DIFFERENTIAL SIGNALS

(75) Inventors: Atul V. Ghia, San Jose; Suresh M. Menon, Sunnyvale; David P. Schultz, San Jose, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/655,168

(22) Filed: Sep. 5, 2000

(51) Int. Cl.[7] .................... H03K 19/094; H03K 19/173
(52) U.S. Cl. .................. 326/83; 326/44; 326/40; 326/49
(58) Field of Search ................. 326/83, 86, 87, 326/38, 40, 44, 45, 46, 49, 30

(56) References Cited

U.S. PATENT DOCUMENTS 5,355,035 A * 10/1994 Vora et al. ............. 327/433
5,812,461 A * 9/1998 Komarek et al. ....... 365/189.05
5,958,026 A   9/1999 Goetting et al.

FOREIGN PATENT DOCUMENTS

JP        60260254   *  6/1987  ............. 326/30

OTHER PUBLICATIONS

Electrical Characteristics of Low Voltage Differential Signaling (LVDS) Interface Circuits, TIA/EIA–644, Mar. 1996.
Jon Brunetti and Brian Von Herzen, "Multi–Drop LVDS with Virtex–E FPGAs," XAPP231 (Version 1.0) Sep. 23, 1999.
Application Report "LVDS Multidrop Connections" published by Texas Instruments, Jul. 1999.

* cited by examiner

Primary Examiner—Michael Tokar
Assistant Examiner—Daniel D. Chang
(74) Attorney, Agent, or Firm—Arthur J. Behiel; Edel M. Young

(57) ABSTRACT

Described are systems for producing differential logic signals. These systems can be adapted for use with different loads by programming one or more programmable elements. One embodiment includes a series of driver stages, the outputs of which are connected to one another. The driver stages turn on successively to provide increasingly powerful differential amplification. This progressive increase in amplification produces a corresponding progressive decrease in output resistance, which reduces the noise associated with signal reflection. The systems can be incorporated into programmable IOBs to enable PLDs to provide differential output signals.

23 Claims, 10 Drawing Sheets

US 6,366,128 B1

CIRCUIT FOR PRODUCING LOW-VOLTAGE DIFFERENTIAL SIGNALS

FIELD OF THE INVENTION

This invention relates generally to methods and circuits for providing high-speed, low-voltage differential signals.

BACKGROUND

The Telecommunications Industry Association (TIA) published a standard specifying the electrical characteristics of low-voltage differential signaling (LVDS) interface circuits that can be used to interchange binary signals. LVDS employs low-voltage differential signals to provide high-speed, low-power data communication. The use of differential signals allows for cancellation of common-mode noise, and thus enables data transmission with exceptional speed and noise immunity. For a detailed description of this LVDS Standard, see "Electrical Characteristics of Low Voltage Differential Signaling (LVDS) Interface Circuits," TIA/EIA-644 (March 1996), which is incorporated herein by reference.

FIG. 1 (prior art) illustrates an LVDS generator 100 connected to an LVDS receiver 110 via a transmission line 115. Generator 100 converts a single-ended digital input signal D_IN on a like-named input terminal into a pair of complementary LVDS output signals on differential output terminals TX_A and TX_B. A 100-ohm termination load RL separates terminals TX_A and TX_B, and sets the output impedance of generator 100 to the level specified in the above-referenced LVDS Standard.

LVDS receiver 110 accepts the differential input signals from terminals TX_A and TX_B and converts them to a single-ended output signal D_OUT. The LVDS Standard specifies the properties of LVDS receiver 110. The present application is directed to differential-signal generators: a comprehensive discussion of receiver 110 is not included in the present application.

FIG. 2 (prior art) schematically depicts LVDS generator 100 of FIG. 1. Generator 100 includes a preamplifier 200 connected to a driver stage 205. Preamplifier 200 receives the single-ended data signal D_IN and produces a pair of complementary data signals D and D/ (signal names terminating in "/" are active low signals). Unless otherwise specified, each signal is referred to by the corresponding node designation depicted in the figures. Thus, for example, the input terminal and input signal to generator 100 are both designated D_IN. In each instance, the interpretation of the node designation as either a signal or a physical element is clear from the context.

Driver stage 205 includes a PMOS load transistor 207 and an NMOS load transistor 209, each of which produces a relatively stable drive current in response to respective bias voltages PBIAS and NBIAS. Driver stage 205 additionally includes four drive transistors 211, 213, 215, and 217.

If signal D_IN is a logic one (e.g., 3.3 volts), preamplifier 200 produces a logic one on terminal D and a logic zero (e.g., zero volts) on terminal D/. The logic one on terminal D turns on transistors 211 and 217, causing current to flow down through transistors 207 and 211, up though termination load RL, and down through transistors 217 and 209 to ground (see the series of arrows 219). The current through termination load RL develops a negative voltage between output terminals TX_A and TX_B.

Conversely, if signal D_IN is a logic zero, preamplifier 200 produces a logic zero on terminal D and a logic one on terminal D/. The logic one on terminal D/ turns on transistors 213 and 215, causing current to flow down through transistor 207, transistor 215, termination load RL, transistor 213, and transistor 209 to ground (see the series of arrows 221). The current through termination load RL develops a positive voltage between output terminals TX_A and TX_B.

FIG. 3 (prior art) is a waveform diagram 300 depicting the signaling sense of the voltages appearing across termination load RL of FIGS. 1 and 2. LVDS generator 100 produces a pair of differential output signals on terminals TX_A and TX_B. The LVDS Standard requires that the voltage between terminals TX_A and TX_B remain in the range of 250 mV to 450 mV, and that the voltage midway between the two differential voltages remains at approximately 1.2 volts. Terminal TX_A is negative with respect to terminal TX_B to represent a binary one and positive with respect to terminal B to represent a binary zero.

A programmable logic device (PLD) is a well-known type of IC that may be programmed by a user (e.g., a circuit designer) to perform specified logic functions. Most PLDs contain some type of input/output block (IOB) that can be configured either to receive external signals or to drive signals off chip. One type of PLD, the field-programmable gate array (FPGA), typically includes an array of configurable logic blocks (CLBS) that are programmably interconnected to each other and to the programmable IOBs. Configuration data loaded into internal configuration memory cells on the FPGA define the operation of the FPGA by determining how the CLBS, interconnections, block RAM, and IOBs are configured.

IOBs configured as output circuits typically provide single-ended logic signals to external devices. As with other types of circuits, PLDs would benefit from the performance advantages offered by driving external signals using differential output signals. There is therefore a need for IOBs that can be configured to provide differential output signals. There is also a need for LVDS output circuits that can be tailored to optimize performance for different loads.

SUMMARY

The present invention addresses the need for differential-signal output circuits that can be tailored for use with different loads. In accordance with one embodiment, one or more driver stages can be added, as necessary, to provide adequate power for driving a given load. Driver stages are added by programming one or more programmable elements, such as memory cells, fuses, and antifuses.

A differential driver in accordance with another embodiment includes a multi-stage delay element connected to a number of consecutive driver stages. The delay element produces two or more pairs of complementary input signals in response to each input-signal transition, each successive signal pair being delayed by some amount relative to the previous signal pair. The pairs of complementary signals are conveyed to respective driver stages, so that each driver stage successively responds to the input-signal transition. The output terminals of the driver stages are connected to one another and to the output terminals of the differential driver. The differential driver thus responds to each input-signal transition with increasingly powerful amplification. The progressive amplification produces a corresponding progressive reduction in output resistance, which reduces the noise normally associated with signal reflection.

Extendable and multi-stage differential amplifiers in accordance with the invention can be adapted for use in PLDs. In one embodiment, adjacent pairs of IOBs are each provided with half of the circuitry required to produce LVDS signals. Adjacent pairs of IOBs can therefore be used either individually to provide single-ended input or output signals or can be combined to produce differential output signals.

This summary does not limit the invention, which is instead defined by the appended claims.

DETAILED DESCRIPTION

Figure 3:
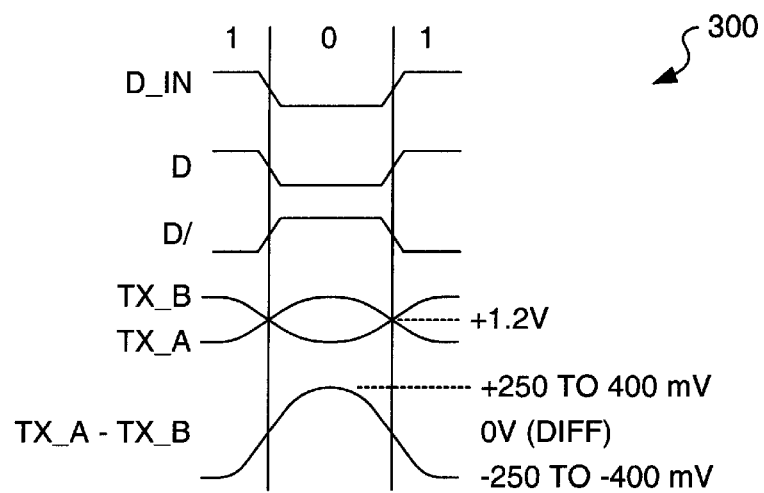
FIG. 3 (prior art) is a waveform diagram 300 depicting the signaling sense of the voltages appearing across termination load RL of FIGS. 1 and 2.
Figure 4:
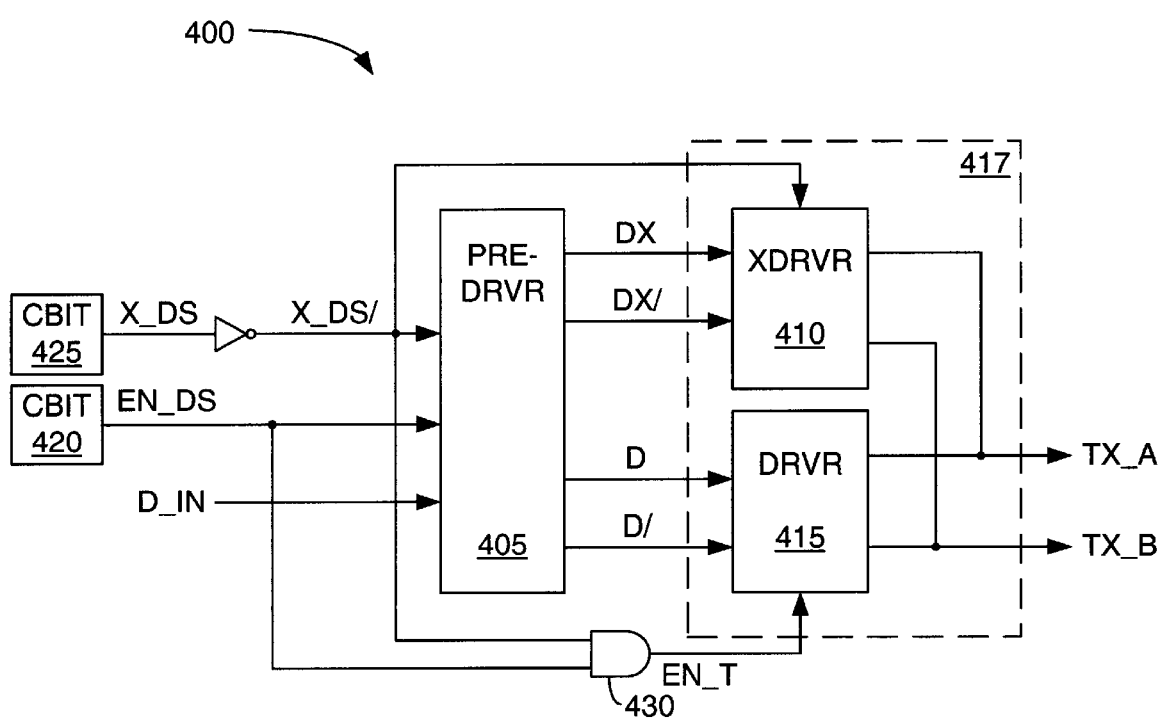
FIG. 4 depicts an extensible differential amplifier 400 in accordance with an embodiment of the invention.

FIG. 4 depicts an extensible differential amplifier 400 in accordance with an embodiment of the invention. Amplifier 400 includes a predriver 405 connected to a pair of driver stages 410 and 415. The combination of predriver 405 and driver 415 operates as described above in connection with FIGS. 2 and 3 to convert the single-ended input on terminal D_IN into differential output signals on lines TX_A and TX_B. In accordance with the invention, driver 410 can be activated as needed to provide additional drive power. In one embodiment, drivers 410 and 415 reside within a pair of adjacent programmable IOBs (collectively labeled 417) and lines TX_A and TX_B connect to the respective input/output (I/O) pads of the pair. This aspect of the invention is detailed below.

The program state of a configuration bit 420 determines whether amplifier 400 is enabled, and the program state of a second configuration bit 425 determines whether the driver stage of amplifier 400 is extended to include driver 410. An exemplary configuration bit is described below in connection with FIG. 8A.

If bit 420 is programmed to provide a logic one on "enable differential signaling" line EN_DS, then predriver 405 and driver 415 function in a manner similar to that described above in connection with FIG. 2. If desired, the drive circuitry can be extended to include driver 410 by programming bit 425 to provide a logic one on "extended differential signaling" line X_DS. The signals on lines X_DS and EN_DS are logically combined using an AND gate 430 to produce an "enable termination load" signal EN_T to driver 415. This signal and its purpose are described below in connection with FIG. 5B.

Figure 5A:
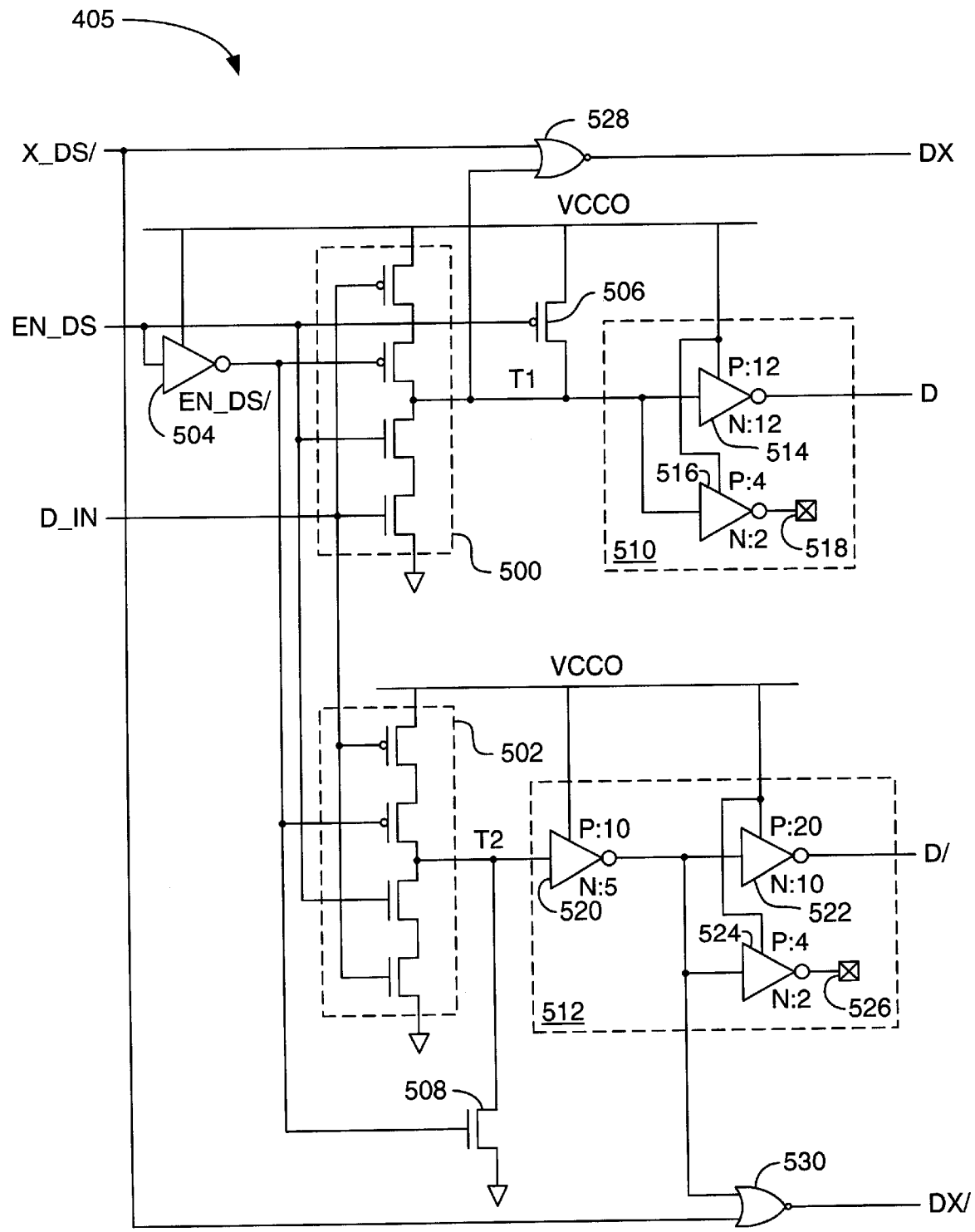
FIG. 5A is a schematic diagram of predriver 405 of FIG. 4.

FIG. 5A is a schematic diagram of an embodiment of predriver 405 of FIG. 4. Predriver 405 includes a pair of conventional tri-state drivers 500 and 502. A conventional inverter 504 provides the complement of signal EN_DS.

Amplifier 400 is inactive when signals EN_DS and EN_DS/ are low and high, respectively. These logic levels cause tristate drivers 500 and 502 to disconnect input terminal D_IN from respective tristate output terminals T1 and T2. Signal EN_DS and its complementary signal EN_DS/ also connect terminals T1 and T2 to respective supply voltages VCCO and ground by turning on a pair of transistors 506 and 508. Thus, terminals T1 and T2 do not change in response to changes on input terminal D_IN when differential signaling is disabled. In the case where amplifier 400 is implemented using IOBs in a programmable logic device, amplifier 400 may be disabled to allow the IOBs to perform some other input or output function.

Amplifier 400 is active when signals EN_DS and EN_DS/ are high and low, respectively. These logic levels cause tristate drivers 500 and 502 to connect input terminal D_IN to respective tristate output terminals T1 and T2. Signal EN_DS and its complementary signal EN_DS/ also disconnect terminals T1 and T2 from respective supply voltages VCCO and ground by turning off transistors 506 and 508. Thus, terminals T1 and T2 change in response to signal D_IN when differential signaling is enabled.

Tristate output terminals T1 and T2 connect to the respective input terminals of an inverting predriver 510 and a non-inverting predriver 512. Predriver 510 includes a pair of conventional inverters 514 and 516. Inverter 514 produces a signal D, an inverted and amplified version of the signal on line T1; inverter 516 provides a similar signal to a test pin 518. Predriver 512 includes three conventional inverters 520, 522, and 524. Predriver 512 produces a signal D/, the complement of signal D. Inverter 524 provides a similar signal to a test pin 526.

Each inverter within predrivers 510 and 512 is a CMOS inverter in which the ratios of the PMOS and NMOS transistors are as specified. These particular ratios were selected so that signals D and D/ transition simultaneously, or very nearly so. Different ratios may be appropriate, depending upon the process used to produce amplifier 400. Adjusting layout and process parameters to produce synchronized complementary signals is within the skill of those in the art.

As discussed above in connection with FIG. 4, amplifier 400 can be extended to include additional drive circuitry, which may be needed to drive some loads while remaining in compliance with the LVDS Standard. Returning to FIG. 5A, a pair of NOR gates 528 and 530 facilitates this extension by producing a pair of complementary extended-data signals DX and DX/ when signal X_DS/ is a logic zero, indicating the extended driver is enabled. Extended-data signal DX is substantially the same as signal D, and extended data signal DX/ is substantially the same as signal D/. Signals DX and DX/ are conveyed to extended driver 410, the operation of which is detailed below in connection with FIG. 5C.

Figure 1:
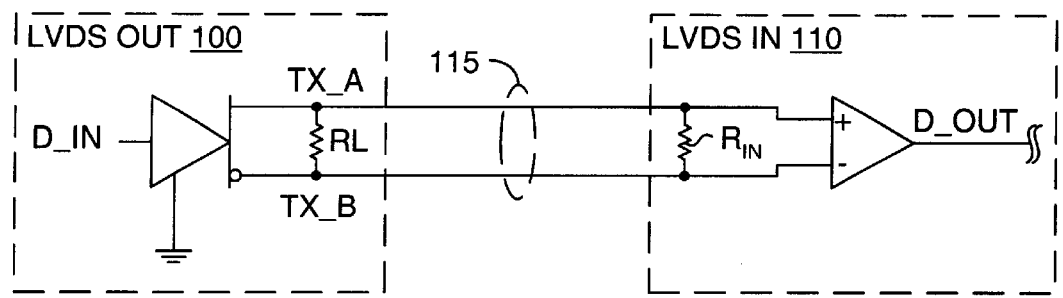
FIG. 1 (prior art) illustrates an LVDS generator 100 connected to an LVDS receiver 110 via a transmission line 115.
Figure 2:
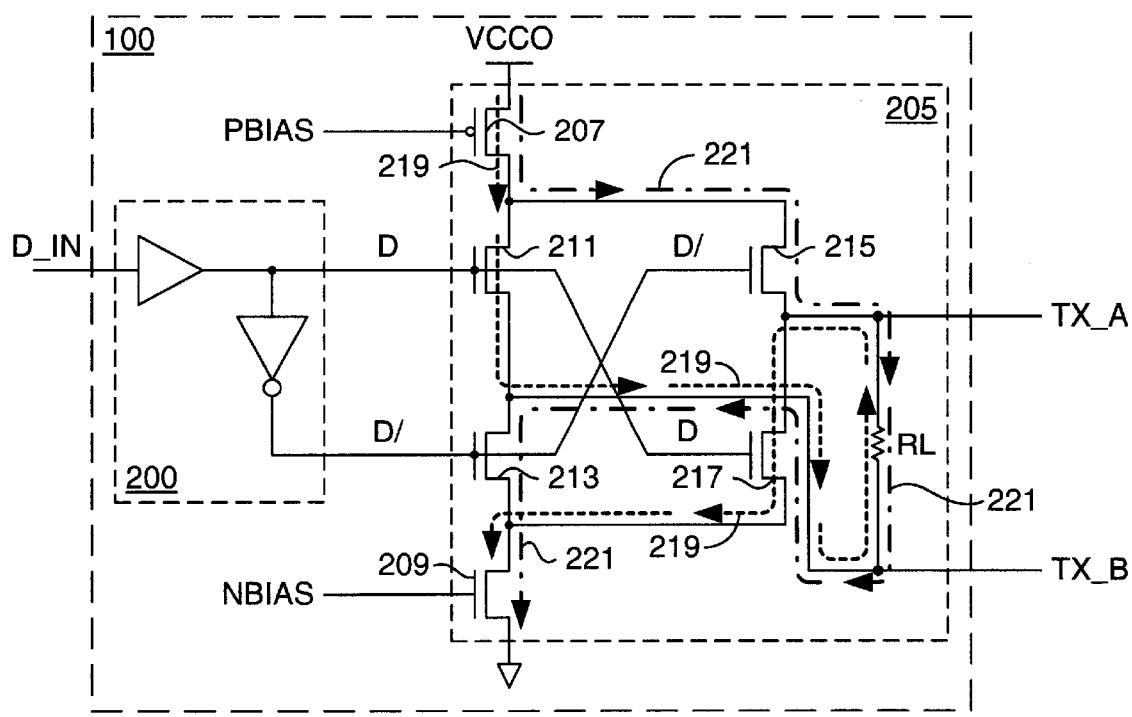
FIG. 2 (prior art) schematically depicts LVDS generator 100 of FIG. 1
Figure 5B:
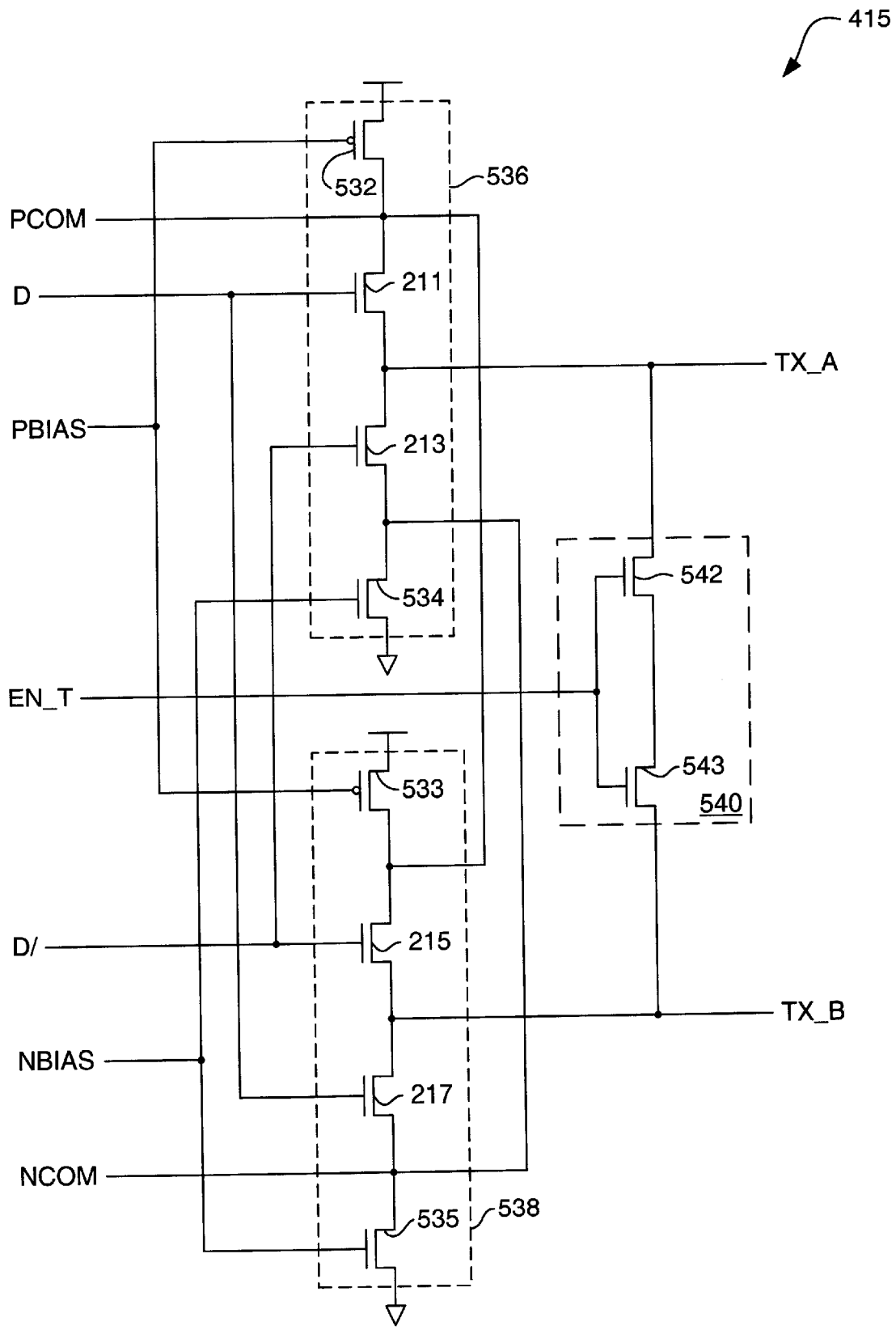
FIG. 5B is a schematic diagram of driver 415 of FIG. 4.

FIG. 5B is a schematic diagram of driver 415 of FIG. 4. Driver 415 is similar to driver stage 205 of FIG. 2, like-numbered elements being the same. Unlike driver 205, however, driver 415 includes a programmable termination load 540. Further, load transistors 207 and 209 of FIG. 2 are replaced with pairs of parallel transistors, so that transistors 211 and 215 connect to VCCO via respective PMOS transistor 532 and 533, instead of via a single transistor 207, and transistors 213 and 217 connect to ground via respective NMOS transistors 534 and 535, instead of via a single transistor 209.

Employing pairs of load transistors allows driver 415 to be separated into two similar parts 536 and 538, each associated with a respective one of terminals TX_A and TX_B. Such a configuration is convenient, for example, when driver 415 is implemented on a PLD in which terminals TX_A and TX_B connect to neighboring I/O pins. Each part 536 and 538 can be implemented as a portion of the IOB (not shown) associated with the respective one of terminals TX_A and TX_B. Termination load 540 can be part of either IOB, neither IOB, or can be split between the two. In one embodiment, transistor 542 is included in the IOB that includes part 536, and transistor 543 is included in the IOB that includes part 538.

Programmable termination load 540 includes a pair of transistors 542 and 543, the gates of which connect to terminal EN_T. As shown in FIG. 4, the signal EN_T is controlled through AND gate 430 by configuration bits 420 and 425. Termination load 540 is active (conducting) only when differential signaling is enabled in the non-extended mode. This condition is specified when configuration bit 420 is set to a logic one and configuration bit 425 is set to a logic zero.

Driver 415 includes a number of terminals that provide appropriate bias voltages. Terminals PBIAS and NBIAS provide respective bias levels establish the gain driver 415, and common terminals PCOM and NCOM conventionally establish the high and low voltage levels on output terminals TX_A and TX_B. Driver 415 shares the bias and common terminals with extended driver 410 (See FIG. 5C).

The bias levels PBIAS and NBIAS are important in defining LVDS signal quality. In one embodiment, NMOS transistors 534 and 535 are biased to operate in saturation to sink a relatively stable current, whereas PMOS transistors 532 and 533 are biased to operate in a linear region. Operating transistors 532 and 533 in a linear region reduces the output resistances of those devices, and the reduced resistance tends to dissipate signal reflections returning to terminals TX_A and TX_B. Reduced reflections translate into reduced noise, and reduced noise allows signals to be conveyed at higher data rates. Circuits for developing appropriate bias levels for the circuits of FIGS. 5A–7B are discussed below in connection with FIGS. 8A and 8B.

Figure 5C:
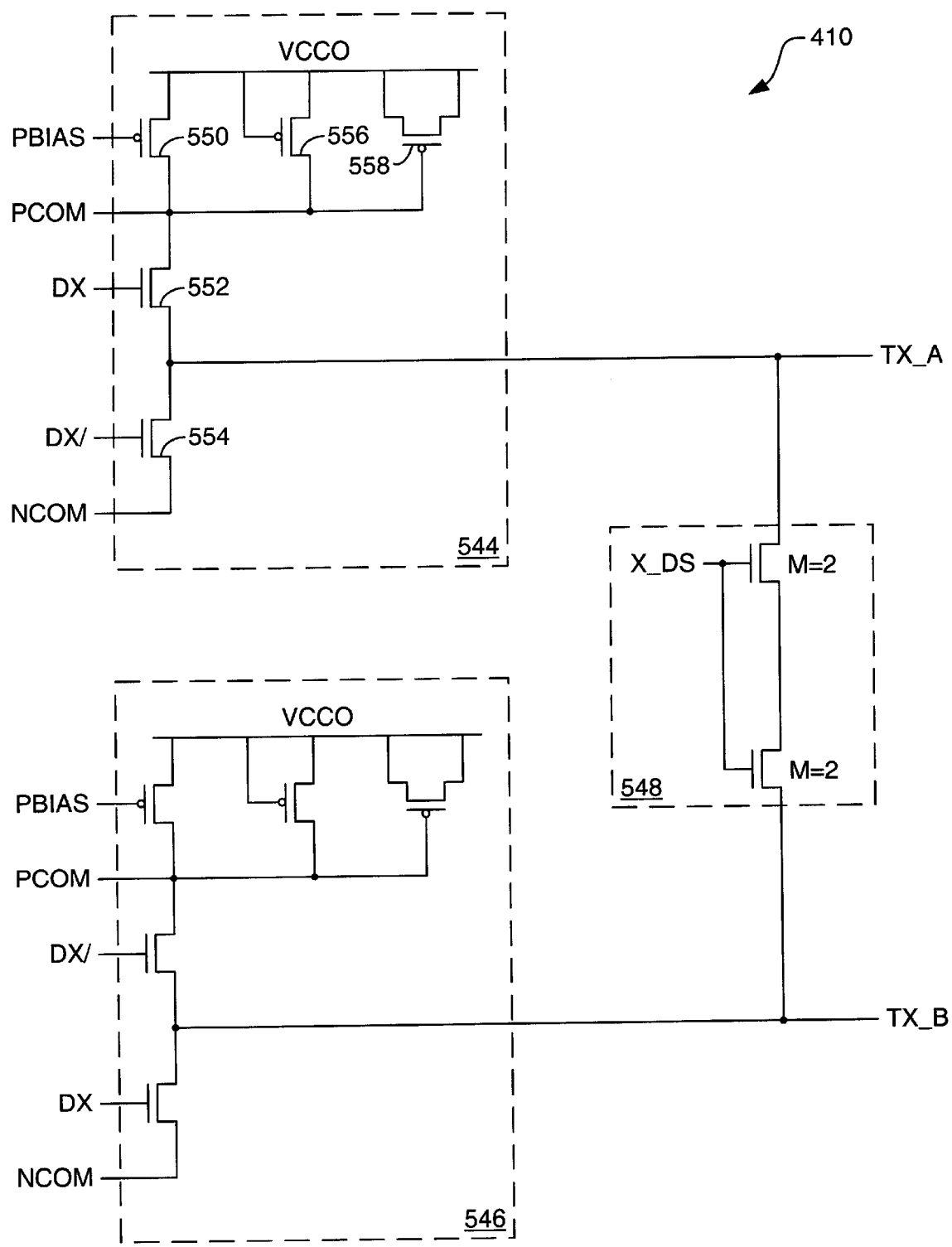
FIG. 5C is a schematic diagram of extended driver 410 of FIG. 4.

FIG. 5C is a schematic diagram of one embodiment of extended driver 410 of FIG. 4. Extended driver 410 includes a pair of driver stages 544 and 546 and a programmable termination load 548. Driver stages 544 and 546 can be included, for example, in respective adjacent IOBs on a PLD. Termination load 548 can be part of either IOB, neither IOB, or can be split between the two. The various terminals of FIG. 5C are connected to like-named terminals of FIGS. 5A and 5B.

Driver stage 544 includes a PMOS load transistor 550, a pair of NMOS differential-driver transistors 552 and 554 having their gates connected to respective extended-driver input signals DX and DX/, a diode-connected PMOS transistor 556, and a PMOS transistor 558 connected as a capacitor 14 between terminal VCCO and terminal PCOM. Transistors 550, 552, and 554 combined amplify the extended-driver signals DX and DX/ to produce an amplified output signal on output terminal TX_A. In one embodiment, transistor 556 is diode-connected between terminals PCOM and VCCO to establish the appropriate level for line PCOM, which is common to both drivers 410 and 415. Finally, transistor 558 can be sized or eliminated as desired to minimize noise on line PCOM. Driver stage 546 is identical to driver stage 544, except that lines DX and DX/ are connected to the opposite differential driver transistors. Consequently, the signals on output terminals TX_A and TX_B are complementary. Driver stages 544 and 546 thus supplement the drive strength provided by driver stage 415.

As shown in FIG. 4, the extend-differential-signaling signal X_DS is a logic one when CBIT 425 is programmed. However, programming CBIT 425 causes AND gate 430 to output a logic zero, disabling termination load 532 of FIG. 5B. Thus, programming CBIT 425 substitutes termination load 548 for termination load 532, thereby increasing the termination load resistance to an appropriate level. In one embodiment, the resistance of termination load 532 is selected so that the resulting output signal conforms to the LVDS Standard.

Figure 6:
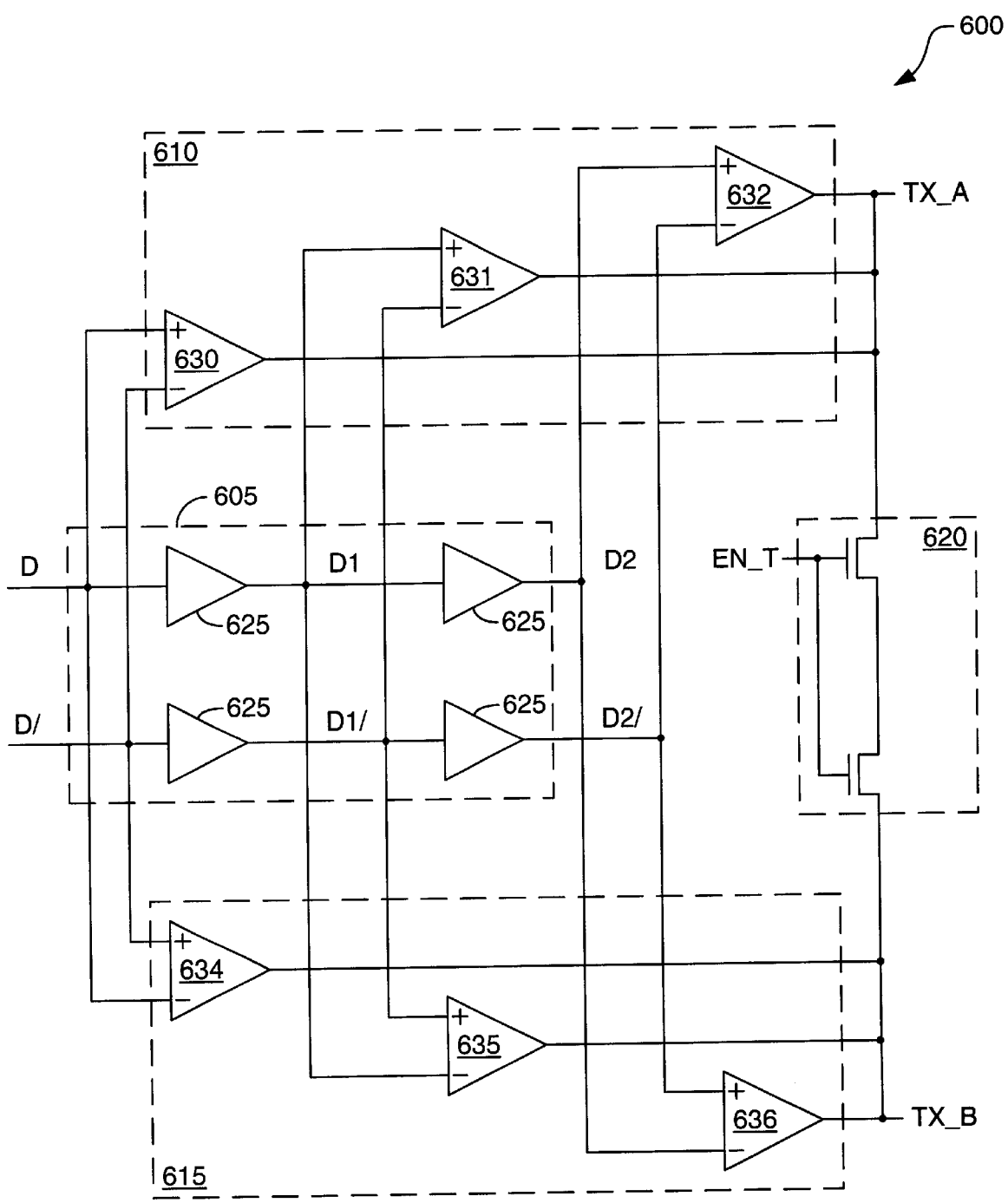
FIG. 6 depicts a multi-stage driver 600 in accordance with another embodiment of the invention.

FIG. 6 depicts a multi-stage driver 600 in accordance with another embodiment of the invention. Driver 600 includes a multi-stage delay circuit 605, a first sequence of differential amplifiers 610, a second sequence of differential amplifiers 615, and a termination load 620. For illustrative purposes, the amplifiers of sequences 610 and 615 are referred to as "high-side" and "low-side" amplifiers, respectively. In different embodiments, each amplifier sequence 610 and 615 can be implemented as a portion of the IOB (not shown) associated with the respective one of terminals TX_A and TX_B. Termination load 620 can be part of either IOB, neither IOB, or can be split between the two.

Delay circuit 605 receives a pair of complementary signals D and D/ on a like-named pair of input terminals. A sequence of delay elements—conventional buffers 625 in the depicted example—provides a first pair of delayed complementary signals D1 and D1/ and a second pair of delayed complementary signals D2 and D2/.

Sequence 610 includes three differential amplifiers 630, 631, and 632, the output terminals of which connect to one another and to output terminal TX_A. The differential input terminals of each of these high-side amplifiers connect to respective complementary terminals from delay circuit 605. That is, the non-inverting (+) and inverting (−) terminals of differential amplifier 630 connect to respective input terminals D and D/, the non-inverting and inverting terminals of differential amplifier 631 connect to respective input terminals D1 and D1/, and the non-inverting and inverting terminals of differential amplifier 632 connect to respective input terminals D2 and D2/. When the signal on terminal D transitions from low to high, each of amplifiers 630, 631, and 632 consecutively joins in pulling the voltage level on terminal TX_A high as the signal edges on terminals D and D/ propagate through delay circuit 605. Conversely, when the signal on terminal D transitions from high to low, each of amplifiers 630, 631, and 632 consecutively joins in pulling the voltage level on terminal TX_A low.

Sequence 615 includes three differential amplifiers 634, 635, and 636, the output terminals of which connect to one another and to terminal TX_B. Sequence 615 is similar to sequence 610, except that the differential input terminals of the various low-side differential amplifiers are connected to opposite ones of the complementary signals from delay circuit 605. Thus, when the signal on terminal D transitions from low to high, each of amplifiers 634, 635, and 636 consecutively joins in pulling the voltage level on terminal TX_B low as the signal edges on terminals D and D/ propagate through delay circuit 605, and when the signal on terminal D transitions from high to low, each of amplifiers 634, 635, and 636 consecutively joins in pulling the voltage level on terminal TX_B high.

Figure 7A:
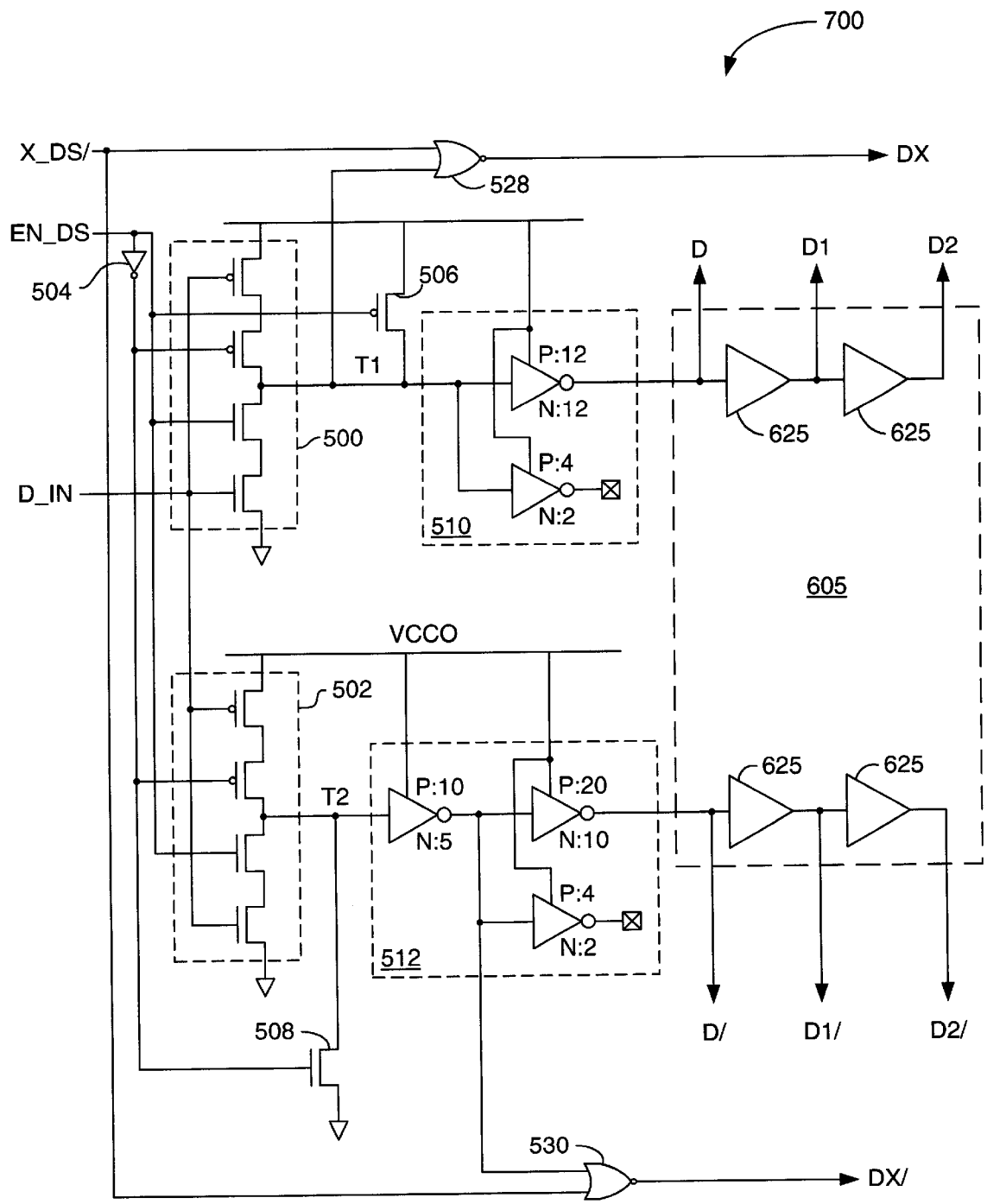
FIG. 7A schematically depicts a predriver 700 in which a predriver is connected to delay circuit 605 of FIG. 6 to develop three complementary signal pairs.
Figure 7B:
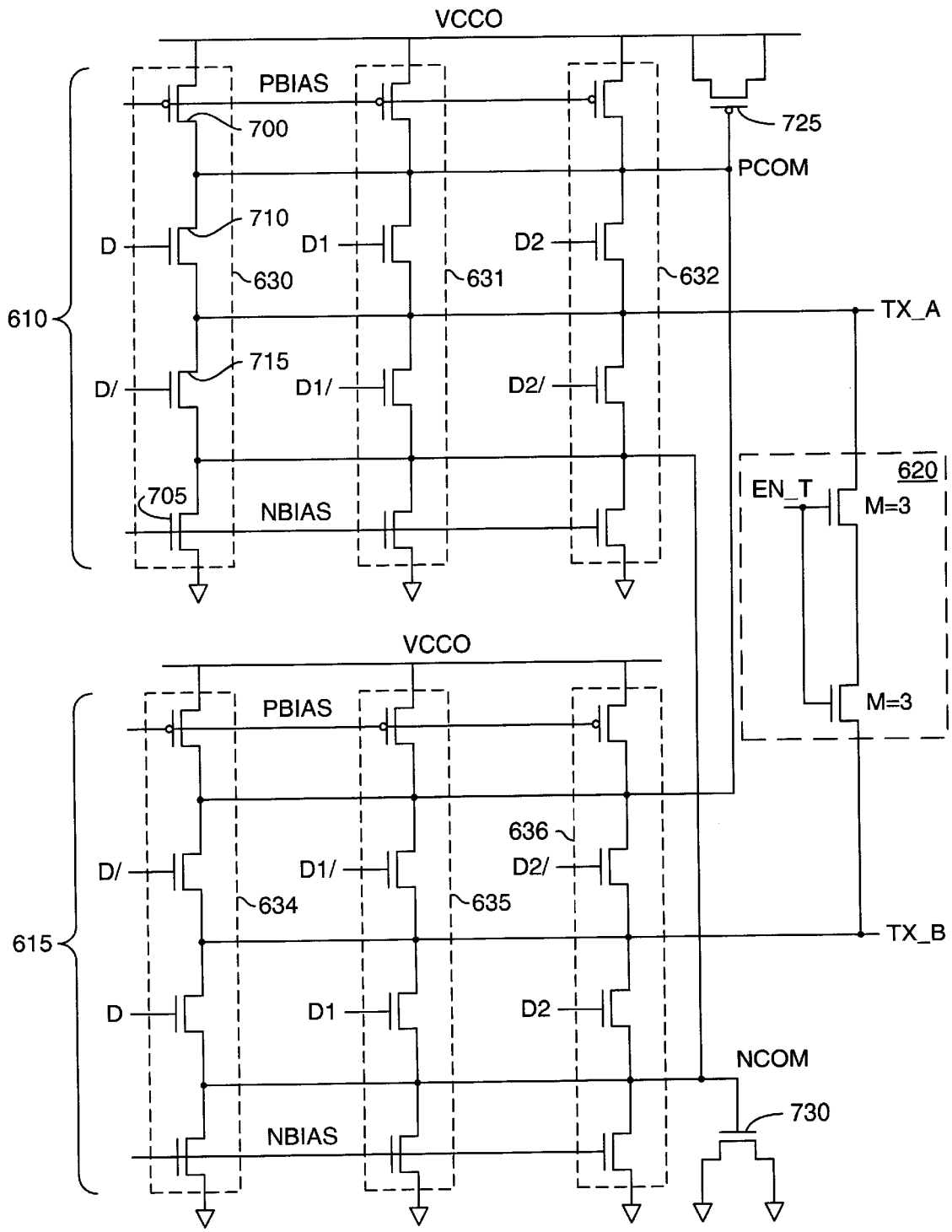
FIG. 7B schematically depicts differential-amplifier sequences 610 and 615 and termination load 620, all of FIG. 6.
Figure 8A:
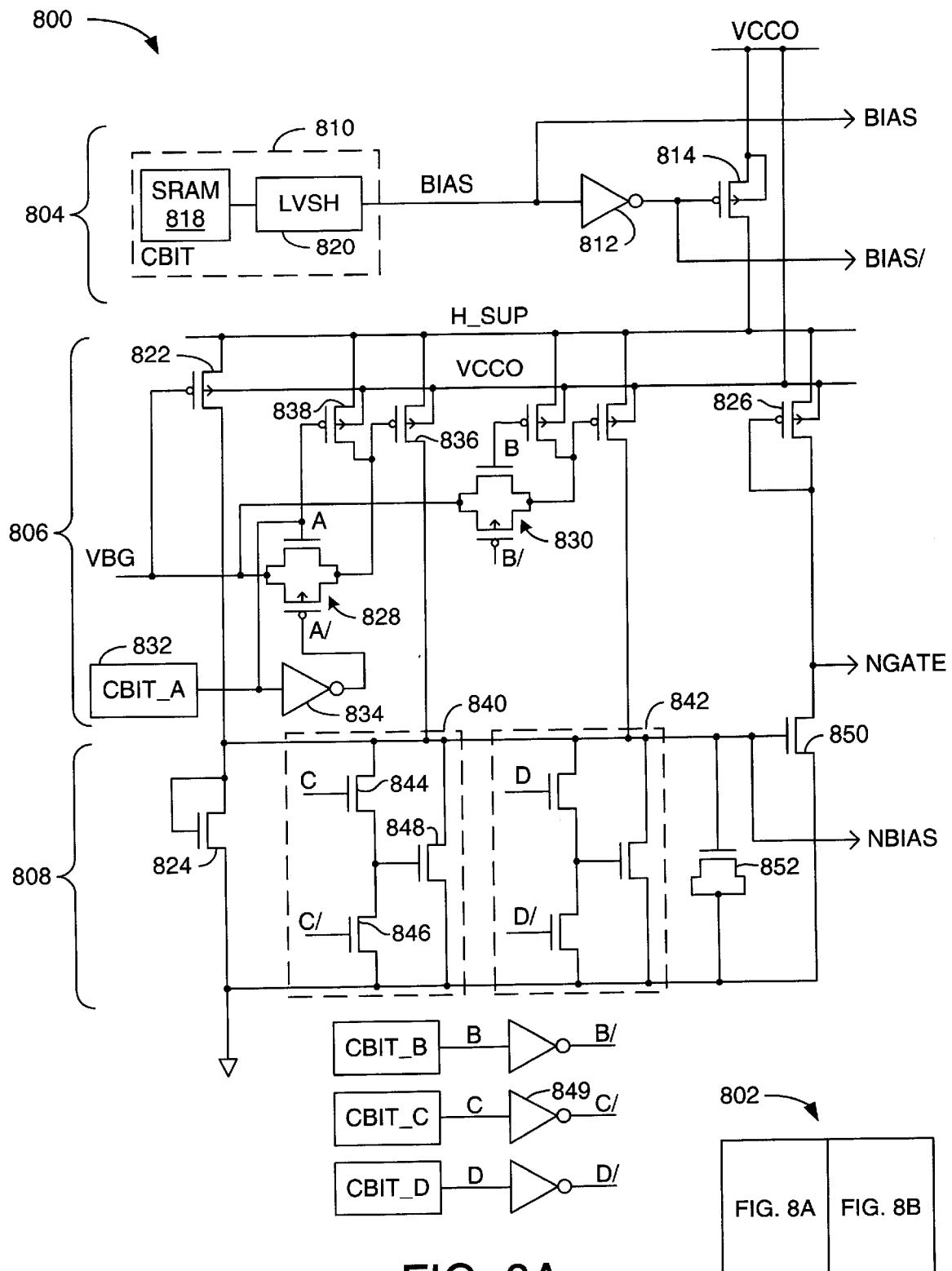
FIGS. 8A and 8B schematically depict a programmable bias-voltage generator 800 in accordance with an embodiment of the invention.
Figure 8B:
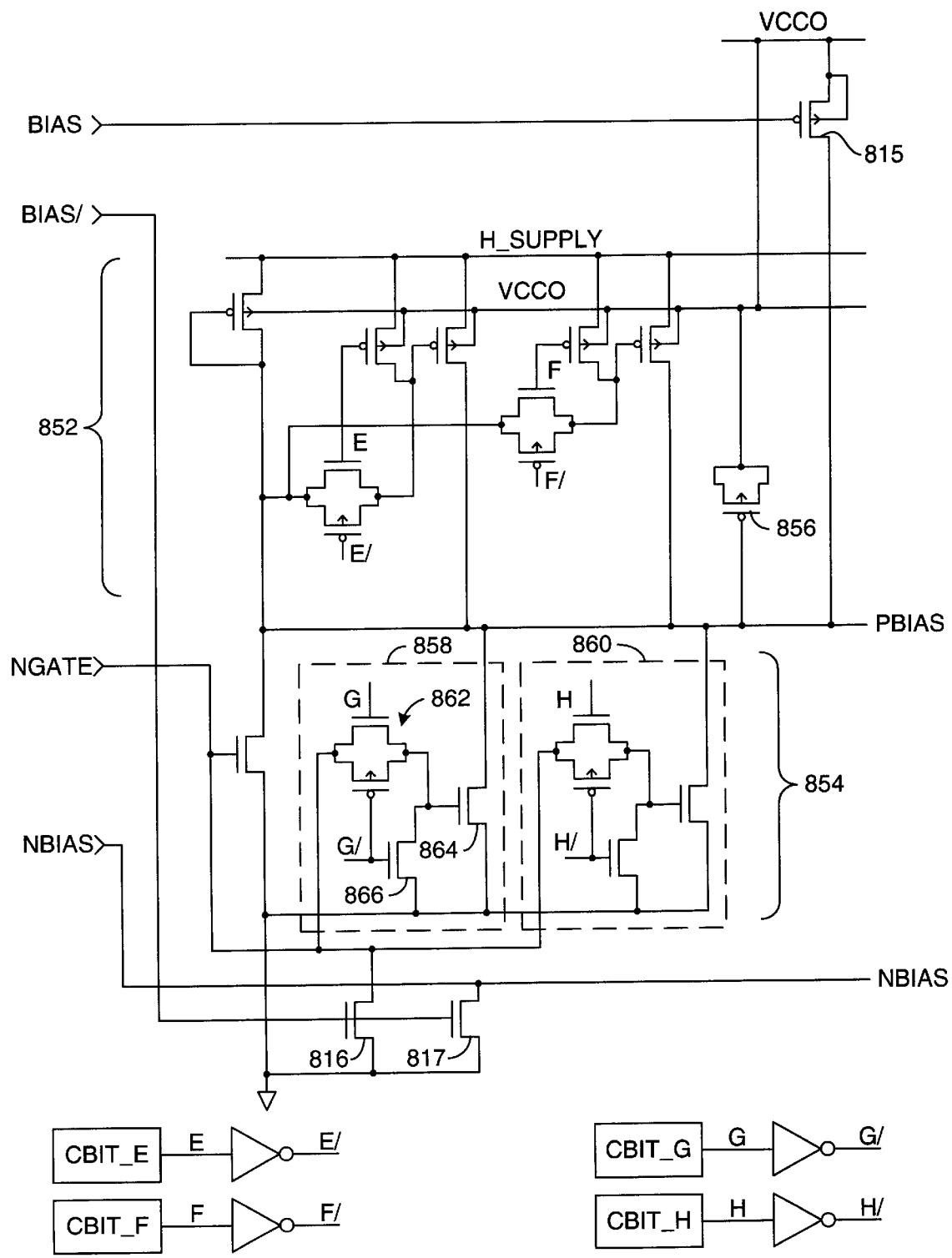

Driver stage 600 is similar to driver stage 415 of FIGS. 4 and 5A, except that driver stage 600 progressively increases the drive strength used to provide amplified signals across termination load 620, and consequently progressively reduces the output resistance of driver stage 600. Progressively reducing the output resistance of amplifier 600 reduces the amplitude of reflected signals. This effect, in turn, reduces the noise and increases the useable data rate of the LVDS circuitry. While illustrated as having three driver stages, other embodiments of amplifier 600 include more or fewer stages. FIG. 7A schematically depicts a predriver 700 in which predriver 405, detailed in FIG. 5A, is connected to delay circuit 605 of FIG. 6 to develop the three complementary signal pairs (e.g., D and D/) of FIG. 6. The various elements of predriver 405 are described above in connection with FIG. 5A, like-numbed elements being identical. In one embodiment, each buffer 625 is an instance of non-inverting delay circuit 512. FIG. 7B schematically depicts differential-amplifier sequences 610 and 615 and termination load 620, all of FIG. 6. The differential amplifiers in sequences 610 and 615 are substantially identical, except the D and D/ input terminals are reversed. The following description is limited to a single differential amplifier (630) for brevity. Differential amplifier 630 includes a PMOS load transistor 700, an NMOS load transistor 705, and a pair of active transistors 710 and 715 having their respective gates connected to data inputs D and D/. One embodiment of amplifier 400 of FIG. 4 employs driver stage 600 in place of driver 415 (detailed in FIG. 5B). Amplifier sequence 610 may include a capacitor 725 between PCOM and VCCO, and amplifier sequence 615 may include a capacitor 730 connected between NCOM and ground. These capacitors can be sized to minimize noise. FIGS. 8A and 8B schematically depict a programmable bias-voltage generator 800 in accordance with an embodiment of the invention. A key 802 in the bottom right-hand corner of FIG. 8A shows the relative arrangement of FIGS. 8A and 8B.

The portion of generator 800 depicted in FIG. 8A may be divided into three general areas: bias-enable circuitry 804, NBIAS pull-up circuitry 806, and NBIAS pull-down circuitry 808. As their respective names imply, bias-enable circuitry 804 determines whether bias generator 800 is active, NBIAS pull-up circuitry 806 can be used to raise the NBIAS voltage level, and NBIAS pull-down circuitry 808 can be used to reduce the NBIAS voltage level. The NBIAS pull-up and pull-down circuitry are programmable to allow users to vary the NBIAS voltage as desired.

Bias-enable circuitry 804 includes a configuration bit (CBIT) 810, an inverter 812, a PMOS transistor 814, and, in FIG. 8B, a PMOS transistor 815 and a pair of NMOS transistors 816 and 817. CBIT 810 is conventional, in one embodiment including an SRAM configuration memory cell 818 connected to a level-shifter 820. Level-shifter 820 is used because bias generator 800 is a portion of the output circuitry of a PLD, and operates at higher voltage (e.g., 3.3 volts) than the core circuitry (e.g., 1.5 volts) of the PLD: level-shifter 820 increases the output voltage of SRAM cell 816 to an appropriate voltage level. Some embodiments that employ lower core voltages use thicker gate insulators in the transistors of the I/O circuitry. The gate insulators of differing thickness can be formed using a conventional dual-oxide process. In one embodiment in which the circuits depicted in FIGS. 5A–8B are part of the output circuitry of a PLD, each of the depicted devices employs relatively thick gate insulators.

Generator 800 is activated by programming SRAM cell 818 to include a logic one, thereby causing bias-enable circuitry 804 to output a logic one on line BIAS. This logic one connects high-supply-voltage line H_SUP to supply voltage VCCO through transistor 814 and disconnects line PBIAS from VCCO to enable line PBIAS to carry an appropriate bias voltage. The inverted signal BIAS/ from inverter 812, a logic zero when active, disconnects lines NBIAS and NGATE from ground, thereby allowing those lines to carry respective bias voltages. The logic levels on lines PBIAS and NBIAS are one and zero, respectively, when SRAM cell 818 is set to logic zero.

NBIAS pull-up circuitry 806 has an input terminal VBG connected to a conventional band-gap reference, or some other suitable voltage reference. The voltage level and line VBG turns on a PMOS transistor 822 that, in combination with diode-connected transistors 824 and 826, produces bias voltage levels on lines NGATE and NBIAS. Terminal VBG also connects to a pair of transmission gates 828 and 830, each consisting of NMOS and PMOS transistors connected in parallel. The transmission gates are controlled by configuration bits similar to CBIT 810. For example, transmission gate 828 can be turned on by programming CBIT_A to contain a logic one. The logic one produces a logic one on line A and, via an inverter 834, a logic zero on line Al. Transmission gate 828 passes the reference voltage on line VBG to the gate of a PMOS transistor 836, thereby reducing the resistance between VCCO and line NBIAS; consequently, the voltage level on line NBIAS rises. Transistor 838 can be turned on and both of transmission gate 828 and transistor 836 can be turned off by programming CBIT_A to contain a logic zero. Transmission gate 830 operates in the same manner as transmission gate 828, but is controlled by a different CBIT (CBIT_B) and an associated inverter. One or both of transmission gates 828 and 830 can be turned on to raise the voltage level on line NBIAS.

NBIAS pull-down circuitry 808 includes a pair of programmable pull-down circuits 840 and 842 that can be programmed independently or collectively to reduce the bias voltage on terminal NBIAS. Pull-down circuits 840 and 842 work the same way, so only circuit 840 is described.

Pull-down circuit 840 includes three transistors 844, 846, and 848. The gates of transistors 844 and 846 connect to terminals C and C/, respectively, from a configuration bit CBIT_C and an associated inverter 849. When CBIT_C is programmed to contain a logic zero, transistors 844 and 848 are turned off, isolating line NBIAS from ground; when CBIT_C is programmed to contain a logic one, transistors 844 and 848 are turned on and transistor 846 turned off. The reduced resistance through transistor 848 reduces the voltage on line NBIAS.

Any change in the bias voltage on line NBIAS results in a change in voltage on line NGATE via a transistor 850. A transistor 852 connected between line NBIAS and ground is an optional capacitor that can be sized or eliminated as desired.

The portion of bias-voltage generator 800 depicted in FIG. 8A adjusts the level of NBIAS; the portion depicted in FIG. 8B adjusts the level of PBIAS. Referring now to FIG. 8B, the portion of FIG. 8B includes PBIAS pull-up circuitry 852 and PBIAS pull-down circuitry 854. PBIAS pull-up circuitry 852 operates in the same manner as NBIAS pull-up circuitry 806 of FIG. 8A to raise the level of the bias voltage on line PBIAS. A pair of configuration bits CBIT_E and CBIT_F and associated inverters control circuitry 852. A capacitor 856 can be sized or eliminated as necessary.

PBIAS pull-down circuitry 854 includes a pair of programmable pull-down circuits 858 and 860 that can be programmed independently or collectively to reduce the bias voltage on terminal PBIAS. Pull-down circuits 858 and 860 work the same way, so only circuit 858 is described.

Pull-down circuit 858 includes a transmission gate 862 and a pair of transistors 864 and 866. With CBIT_G programmed to contain a logic zero, transmission gate 862 is off, transistor 866 on, and transistor 864 off; with CBIT_G programmed to contain a logic one, transistor 866 is off, and transmission gate 862 passes the bias voltage NGATE to the gate of transistor 864, thereby turning transistor 864 on. This reduces the voltage level on line PBIAS.

The present invention can be adapted to supply complementary LVDS signals to more than one LVDS receiver. For details of one such implementation, see "Multi-Drop LVDS with Virtex-E FPGAs," XAPP231 (Version 1.0) by Jon Brunetti and Brian Von Herzen Sep. 23, 1999, which is incorporated herein by reference.

While the present invention has been described in connection with specific embodiments, variations of these embodiments will be obvious to those of ordinary skill in the art. For example, while described in the context of SRAM-based FPGAS, the invention can also be applied to other types of PLDs that employ alternate programming technologies, and some embodiments can be used in non-programmable circuits. Moreover, the present invention can be adapted to convert typical dual-voltage logic signals to other types of differential signals, such as those specified in the Low-Voltage, Pseudo-Emitter-Coupled Logic (LVPECL) standard. Therefore, the spirit and scope of the appended claims should not be limited to the foregoing description.

What is claimed is:

1. A differential amplifier comprising:
   a. a first differential-amplifier stage having:
      i. first and second differential input terminals adapted to receive a differential input signal; and
      ii. first and second differential output terminals;
   b. a second differential-amplifier stage having:
      i. third and fourth differential input terminals adapted to receive the differential input signal;
      ii. third and fourth differential output terminals connected to the first and second differential output terminals; and
      iii. an amplifier-enable terminal; and
   c. a programmable memory cell capable of maintaining a programmed state and a deprogrammed state, the memory cell having a memory-cell output terminal connected to the amplifier-enable terminal;
   d. wherein the second differential amplifier stage amplifies the input signal when the memory cell is in the programmed state and does not amplify the input signal when the memory cell is in the deprogrammed state.

2. The differential amplifier of claim 1, wherein the memory cell stores a voltage representative of a logic one when in the programmed state.

3. The differential amplifier of claim 1, further comprising a predriver having:
   a. a data input terminal adapted to receive an input data signal; and
   b. first and second complementary output terminals connected to respective ones of the first and second differential input terminals.

4. The differential amplifier of claim 3, wherein the predriver further comprises:
   a. a first tri-state buffer having a first tri-state input terminal connected to the data input terminal;
   b. a second tri-state buffer having a second tri-state input terminal connected to the data input terminal;
   c. an inverter having an inverter input terminal connected to the data input terminal and an inverter output terminal connected to the first complementary output terminal; and
   d. a non-inverting delay stage having a delay-stage input terminal connected to the data input terminal and a delay-stage output terminal connected to the second complementary output terminal.

5. The differential amplifier of claim 4, wherein the inverter exhibits a first signal propagation delay and the non-inverting delay stage exhibits a second signal propagation delay substantially equal to the first signal propagation delay.

6. The differential amplifier of claim 1, further comprising a programmable termination load connected between the first and second differential output terminals.

7. The differential amplifier of claim 6, wherein the termination load includes a termination-load enable terminal connected to the memory-cell output terminal.

8. The differential amplifier of claim 6, further comprising a second termination load connected between the first and second differential output terminals.

9. The differential amplifier of claim 8, wherein the second termination load is programmable.

10. An amplifier comprising:
    a. first and second differential input terminals adapted to receive first and second complementary input signals;
    b. a first high-side differential amplifier having:
       i. a first high-side differential amplifier input terminal connected to the first differential input terminal;
       ii. a second high-side differential amplifier input terminal connected to the second differential input terminal; and
       iii. a first high-side differential-amplifier output terminal;
    c. a first low-side differential amplifier having a first low-side differential amplifier input terminal connected to the first differential input terminal and a second low-side differential amplifier input terminal connected to the second differential input terminal;
    d. a delay element having:
       i. a first delay-element input terminal connected to the first differential input terminal and a first delay-element output terminal, the delay element adapted to provide a delayed version of the first complementary input signal on the first delay-element output terminal; and
       ii. a second delay-element input terminal connected to the second differential input terminal and a second delay-element output terminal, the delay element adapted to provide a delayed version of the second complementary input signal on the second delay-element output terminal;
    e. a second high-side differential amplifier having:
       i. a third high-side differential amplifier input terminal connected to the first delay-element output terminal;
       ii. a fourth high-side differential amplifier input terminal connected to the second delay-element output terminal; and
       iii. a second high-side differential-amplifier output terminal connected to the first high-side differential-amplifier output terminal; and f. a second low-side differential amplifier having:
   i. a third low-side differential amplifier input terminal connected to the first delay-element output terminal;
   ii. a fourth low-side differential amplifier input terminal connected to the second delay-element output terminal; and
   iii. a second low-side differential-amplifier output terminal connected to the first low-side differential-amplifier output terminal.

11. The amplifier of claim 10, further comprising a termination load connected between the first high-side and first low-side differential-amplifier output terminals.

12. The amplifier of claim 11, further comprising a programmable memory cell capable of maintaining a programmed state and a deprogrammed state, the memory cell having a memory-cell output terminal connected to the termination load.

13. The amplifier of claim 10, further comprising a second delay element having:
   a. a third delay-element input terminal connected to the first delay-element output terminal of the first-mentioned delay element;
   b. a fourth delay-element input terminal connected to the second delay-element output terminal of the first-mentioned delay element;
   c. a third delay-element output terminal; and
   d. a fourth delay-element output terminal.

14. The amplifier of claim 13, further comprising a third low-side differential amplifier and a third high-side differential amplifier, each having a pair of input terminals connected to respective ones of the third and forth delay-element output terminals.

15. The amplifier of claim 14, wherein the third low-side differential amplifier includes a third low-side differential-amplifier output terminal connected to the first low-side differential-amplifier output terminal, and wherein the third high-side differential amplifier includes a third high-side differential-amplifier output terminal connected to the first high-side differential-amplifier output terminal.

16. The amplifier of claim 10, wherein the first high-side differential amplifier comprises:
   a. an input transistor having a control terminal connected to the first high-side differential-amplifier input terminal, a first input-transistor current-handling terminal connected to the first high-side differential-amplifier output terminal, and a second input-transistor current-handling terminal; and
   b. a load transistor having a control terminal connected to a bias voltage, a first load-transistor current-handling terminal connected to a power terminal, and a second load-transistor current-handling terminal connected to the second input-transistor current-handling terminal.

17. The amplifier of claim 16, further comprising a programmable bias generator adapted to provide the bias voltage on a bias-generator output terminal connected to the control terminal of the load transistor.

18. The amplifier of claim 16, wherein the first high-side differential amplifier further comprises:
   a. a second input transistor having a second control terminal connected to the second high-side differential-amplifier input terminal, a first input-transistor current-handling terminal connected to the first high-side differential-amplifier output terminal, and a second input-transistor current-handling terminal; and
   b. a second load transistor having a control terminal connected to a second bias voltage, a first load-transistor current-handling terminal connected to a second power terminal, and a second load-transistor current-handling terminal connected to the second input-transistor current-handling terminal.

19. The amplifier of claim 18, further comprising a programmable bias generator adapted to provide the first-mentioned bias voltage on a first bias-generator output terminal and the second bias voltage on a second bias-generator output terminal.

20. A programmable logic device comprising:
   a. a predriver having:
      i. a data input terminal adapted to receive an input data signal; and
      ii. complementary first and second predriver output terminals;
   b. first and second input/output pins adapted to convey signals from the programmable logic device;
   c. a first programmable output block including a first differential amplifier, the first differential amplifier having a first differential-amplifier input terminal connected to the first predriver output terminal, a second differential-amplifier input terminal connected to the second predriver output terminal, and a first differential-amplifier output terminal connected to the first input/output pin; and
   d. a second programmable output block including a second differential amplifier, the second differential amplifier having a third differential-amplifier input terminal connected to the first predriver output terminal and a fourth differential-amplifier input terminal connected to the second predriver output terminal, and a second differential-amplifier output terminal connected to the second input/output pin.

21. The programmable logic device of claim 20, wherein the first pin is adjacent the second pin.

22. The programmable logic device of claim 20, further comprising:
   a. an enable terminal connected to at least one of the predriver and the first and second programmable output blocks; and
   b. a programmable memory cell connected to the enable terminal.

23. The programmable logic device of claim 20, further comprising a termination load connected between the first and second input/output pins.

* * * * *